(12) United States Patent
Kang et al.

(10) Patent No.: US 10,037,870 B2
(45) Date of Patent: Jul. 31, 2018

(54) METHOD FOR PREPARING HYDROGEN PLASMA ANNEALING TREATMENT, METHOD FOR PERFORMING HYDROGEN PLASMA ANNEALING TREATMENT, AND APPARATUS THEREFOR

(71) Applicant: Samsung Electronics Co., Ltd., Suwon-si, Gyeonggi-do (KR)

(72) Inventors: Sung-ho Kang, Osan-si (KR); Ki-chul Kim, Seongnam-si (KR); Yong-hun Lee, Hwaseong-si (KR); Pyung Moon, Seoul (KR); Sun-young Lee, Yongin-si (KR); Un-ki Kim, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/260,300

(22) Filed: Sep. 8, 2016

(65) Prior Publication Data

US 2017/0162369 A1 Jun. 8, 2017

(30) Foreign Application Priority Data

Dec. 4, 2015 (KR) .......................... 10-2015-0172659

(51) Int. Cl.
*H01L 21/00* (2006.01)
*H01J 37/32* (2006.01)
*H01L 21/324* (2006.01)

(52) U.S. Cl.
CPC ...... *H01J 37/32871* (2013.01); *H01L 21/324* (2013.01)

(58) Field of Classification Search
CPC .................................................. H01L 21/324
See application file for complete search history.

(56) References Cited

U.S. PATENT DOCUMENTS

| | | | |
|---|---|---|---|
| 6,635,569 B1 | 10/2003 | Ameen et al. | |
| 7,695,567 B2 | 4/2010 | Fu | |
| 8,608,901 B2 | 12/2013 | Ishizuka et al. | |
| 8,622,021 B2 | 1/2014 | Taylor et al. | |
| 2007/0181145 A1* | 8/2007 | Ishizuka | H01J 37/32862 134/1.1 |
| 2012/0270406 A1 | 10/2012 | Tahara et al. | |
| 2015/0229107 A1 | 8/2015 | McLaurin et al. | |
| 2015/0229844 A1 | 8/2015 | Yamazaki et al. | |
| 2015/0230338 A1 | 8/2015 | Hossain et al. | |

FOREIGN PATENT DOCUMENTS

| | | |
|---|---|---|
| JP | 5566891 B2 | 8/2014 |
| KR | 20070034811 A | 3/2007 |

* cited by examiner

*Primary Examiner* — William Harriston
(74) *Attorney, Agent, or Firm* — Renaissance IP Law Group LLP

(57) ABSTRACT

A method of performing a surface treatment includes passivating a surface of an insulating part in a reaction chamber, and then performing a hydrogen plasma annealing treatment on a substrate in the reaction chamber. The passivation of the surface of the insulating part includes supplying a nitrogen-based gas into the reaction chamber and exciting the nitrogen-based gas in the reaction chamber using a plasma generator.

20 Claims, 14 Drawing Sheets

METHOD FOR PREPARING HYDROGEN PLASMA ANNEALING TREATMENT, METHOD FOR PERFORMING HYDROGEN PLASMA ANNEALING TREATMENT, AND APPARATUS THEREFOR

CROSS-REFERENCE TO RELATED APPLICATION

This application claims priority under 35 USC § 119 to Korean Patent Application No. 10-2015-0172659, filed on Dec. 4, 2015, in the Korean Intellectual Property Office, the disclosure of which is incorporated herein in its entirety by reference.

BACKGROUND

Technical field

Embodiments disclosed herein relate to a method for preparing a hydrogen plasma annealing treatment, and a method and an apparatus for performing a hydrogen plasma annealing treatment. More specifically, embodiments disclosed herein relate to a method for preparing a hydrogen plasma annealing treatment that is capable of protecting insulating parts in a reaction chamber and reducing particle-contamination of a substrate, and a method and an apparatus for a hydrogen plasma annealing treatment.

Description of Related Art

As semiconductor devices become smaller and smaller, it is expected that a resistance of a certain region of the semiconductor device can be desirably decreased.

However, crystallographic defects created during manufacturing of the semiconductor device can prevent the resistance of the certain region of the semiconductor device from being reduced to a desired value. Such defects may be cured by an annealing treatment using plasma. Conventional annealing treatments using plasma, however, can undesirably create particles within a plasma treatment apparatus.

SUMMARY

According to an example embodiment, a method for preparing a surface treatment may comprise passivating a surface of an insulating part in a reaction chamber before performing the hydrogen plasma treatment. Passivating the surface of the insulating part may comprise supplying a nitrogen-based gas into the reaction chamber, and exciting the nitrogen-based gas in the reaction chamber using a plasma generator.

According to another example embodiment, a method for performing a plasma annealing treatment may comprise passivating a surface of an insulating part in a reaction chamber, and performing a hydrogen plasma annealing treatment on a substrate in the reaction chamber. Performing the hydrogen plasma annealing treatment on the substrate may comprise supplying a hydrogen gas into the reaction chamber, and exciting the hydrogen gas using a plasma generator to perform the hydrogen plasma annealing treatment on the substrate.

According to another example embodiment, an apparatus for performing a hydrogen plasma annealing treatment may comprise a susceptor configured to support a substrate, a chamber housing enclosing the susceptor and defining reaction space, an insulating liner covering at least a portion of an inner surface of the chamber housing, a baffle plate arranged around a perimeter of the susceptor, a first gas supply unit configured to supply a nitrogen-based gas into the reaction space, a second gas supply unit configured to supply a hydrogen gas into the reaction space, and a plasma generator configured to plasma-excite the gases supplied in the reaction space.

According to another example embodiment, a method for performing a plasma annealing treatment may comprise converting at least a portion of a surface of an insulating part of a reaction chamber into a silicon oxynitride layer, loading a substrate in the reaction chamber, and performing a hydrogen plasma annealing treatment on the substrate.

According to another example embodiment, a method may comprise performing at least one treatment cycle of a surface treatment for an insulating part in a reaction chamber. The surface treatment may include passivating a surface of the insulating part to form a passivation layer. During the at least one treatment cycle, a substrate may be loaded into the reaction chamber and a hydrogen plasma treatment may be performed on the substrate. During the hydrogen plasma treatment, a surface of the passivation layer is modified to form a modified surface having a composition different from that of the passivation layer.

BRIEF DESCRIPTION OF THE DRAWINGS

Example embodiments of inventive concepts disclosed herein will be more clearly understood from the following detailed description, taken in conjunction with the accompanying drawings in which.

DETAILED DESCRIPTION OF THE EMBODIMENTS

Figure 1:
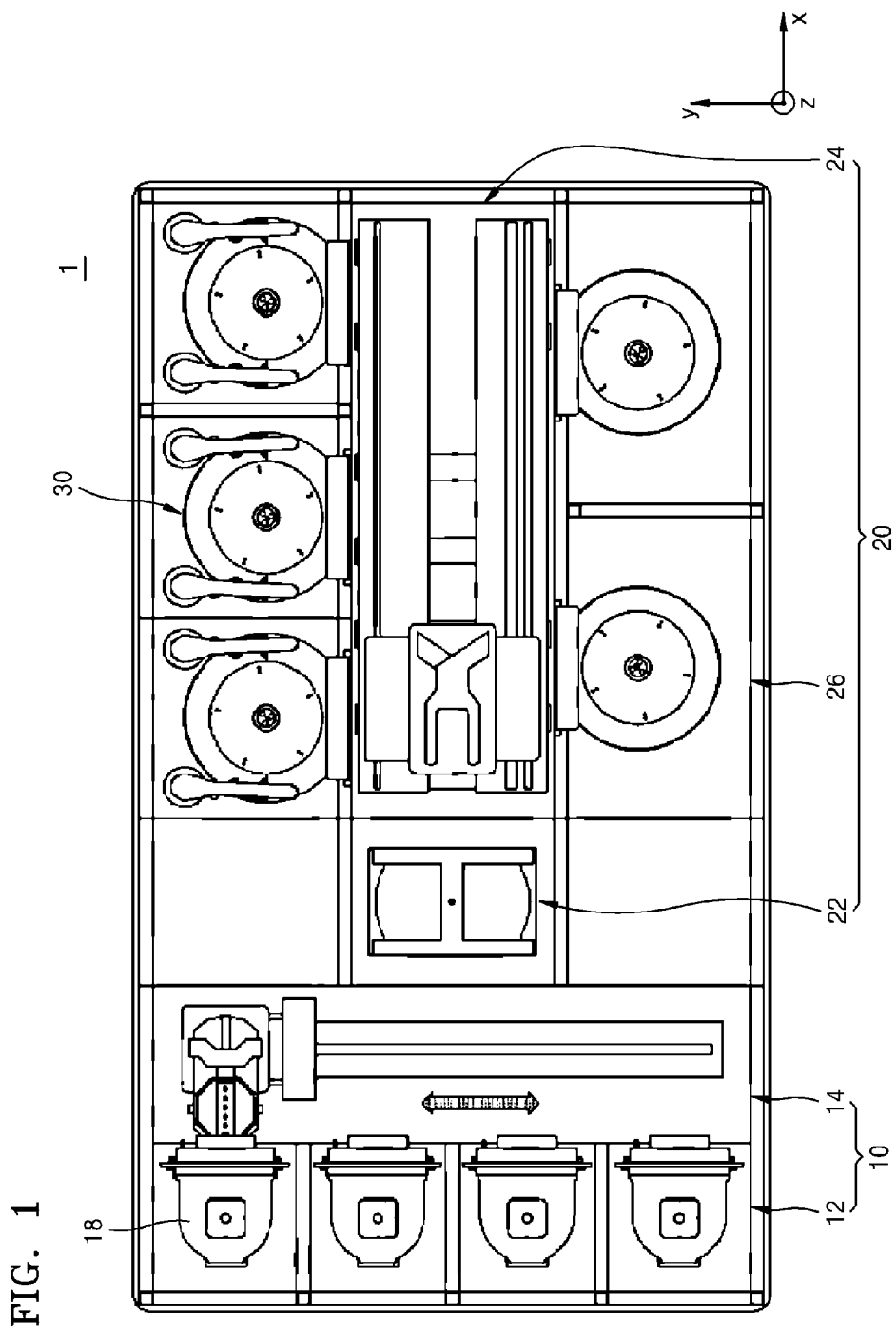
FIG. 1 is a plan view illustrating a substrate processing apparatus according to an example embodiment.

FIG. 1 is a plan view illustrating a substrate processing apparatus according to an example embodiment.

Referring to FIG. 1, a substrate processing apparatus 1 may include an index module 10 and a processing module 20. The index module 10 may include a load port 12 and a transfer frame 14. In some embodiments, the load port 12, the transfer frame 14, and the processing module 20 may be sequentially disposed in a line.

A carrier 18, in which substrates to be processed can be accommodated, may be seated on the load port 12. A front opening unified pod (FOUP) may be used as the carrier 18. Although only one load port 12 is shown, the index module 10 may include multiple load ports 12. The number of load ports 12 may increase or decrease depending on process efficiency and/or footprint requirements of the processing module 20. A plurality of slots may be defined in the carrier 18 to accommodate substrates. The slots may maintain the substrates parallel to the ground.

The processing module 20 may include a buffer unit 22, a transfer chamber 24 and process chambers 26. The process chambers 26 may be disposed at opposing ends of the transfer chamber 24. Further, the process chambers 26 may be provided to be symmetric with respect to the transfer chamber 24.

A plurality of the process chambers 26 may be provided at one side of the transfer chamber 24. In one embodiment, at least some of the process chambers 26 may be disposed along a length direction of the transfer chamber 24. In one embodiment, at least some of the process chambers 26 may be stacked upon each other. The process chambers 26 may be disposed at one side of the transfer chamber 24 in an "A×B" matrix. Herein, "A" may indicate the number of the process chambers 26 disposed in a line along the length direction (e.g., an "x" direction), and "B" may indicate the number of the process chambers 26 stacked upon each other (e.g., disposed in a line along a "y" direction). When four or six process chambers 26 are disposed on respective sides of the transfer chamber 24, the process chambers 26 may be disposed in a "2×2" or "3×2" matrix. The number of the process chambers 26 may increase or decrease. In some embodiments, the process chambers 26 may be disposed at only one side of the transfer chamber 24. In other embodiments, the process chambers 26 may be disposed at one side or opposing sides of the transfer chamber 24 (e.g., in a single level).

The buffer unit 22 may be disposed between the transfer frame 14 and the transfer chamber 24. The buffer unit 22 may provide a room in which the substrate temporarily stays before the substrate is transferred between the process chamber 26 and the carrier 18. The transfer frame 14 may transfer the substrate between the buffer unit 22 and the carrier 18 seated on the load port 12.

The transfer chamber 24 may transfer the substrate between the buffer unit 22 and the process chamber 26, between the process chambers 26, or any combination thereof. At least one plasma treatment apparatus 30, for performing a plasma treatment (a hydrogen plasma treatment) may be provided at one side of the transfer chamber 24.

Figure 2:
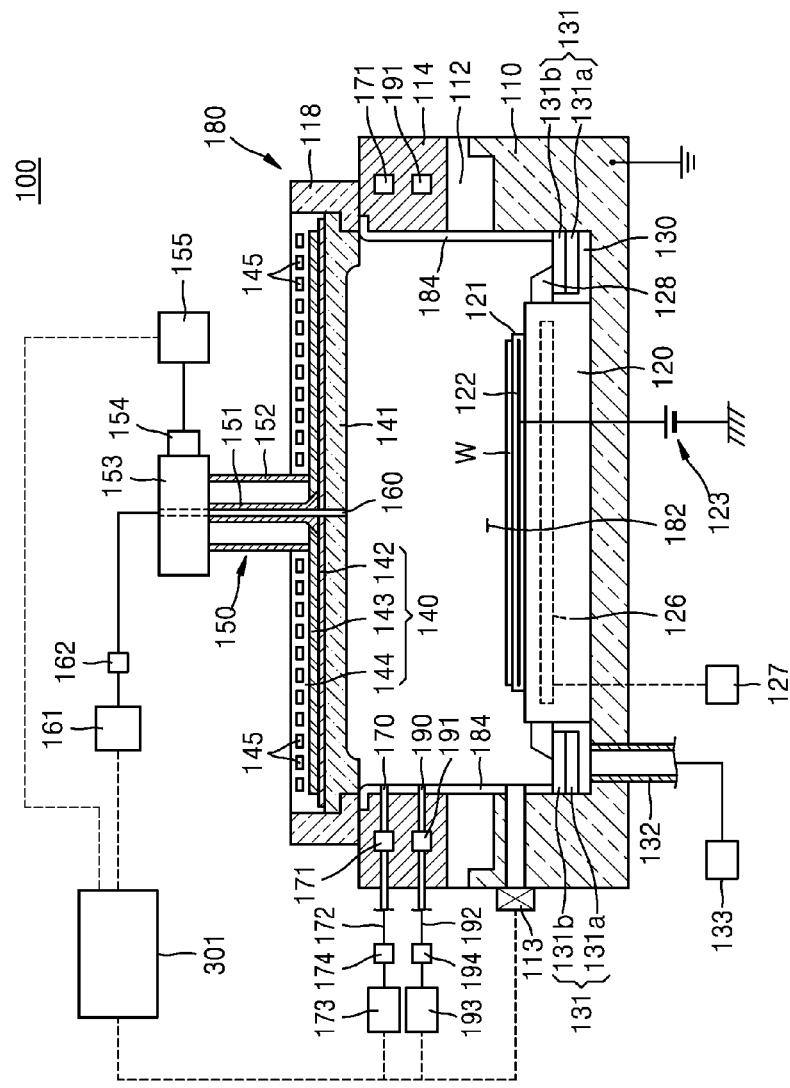
FIG. 2 is a side cross-sectional view illustrating a plasma treatment apparatus according to an example embodiment.

Hereinafter, the plasma treatment apparatus 30 will be described. FIG. 2 is a side cross-sectional view illustrating a hydrogen plasma annealing treatment apparatus 100 as an example of the plasma treatment apparatus 30, according to an example embodiment.

Referring to FIG. 2, a hydrogen plasma annealing treatment apparatus 100 may include a lower chamber 110. The lower chamber 110 may be electrically grounded. A lower gas ring 112, an upper gas ring 114, and a dome plate 118 may be sequentially coupled over the lower chamber 110. A sidewall liner 184 may be provided on an inner side of the lower and upper gas rings 112 and 114. A dome 141 may be provided and form a ceiling of a reaction space 182. The lower chamber 110, the lower gas ring 112, the upper gas ring 114, the dome plate 118, the sidewall liner 184, and the dome 141 may constitute a chamber housing 180 (also referred to herein as a "reaction chamber"), and the reaction space 182 may be defined within the chamber housing 180.

A susceptor 120 may be provided at a bottom of the lower chamber 110 as a support member, on which a substrate W can be placed (i.e., the susceptor 120 may be provided to support a substrate W). The susceptor 120 may have a cylindrical shape, and may be formed of quartz, an inorganic material such as AlN, $Y_2O_3$, a metal such as aluminium, or the like.

An electrostatic chuck 121 may be provided on the susceptor 120. The electrostatic chuck 121 may include an insulating member and an electrode 122 inserted into the insulating member. The electrode 122 may be connected to a direct current power supply 123 that is, for example, installed outside of the lower chamber 110. The substrate W may be electrostatically adhered to the susceptor 120 by a Coulomb force generated on a surface of the susceptor 120 by the direct current power supply 123.

A heater/cooler 126 may be provided in the susceptor 120. The heater/cooler 126 may be connected to a temperature controller 127 to control heating/cooling intensity. The temperature controller 127 may control a temperature of the susceptor 120, thereby maintaining a temperature of the substrate W on the susceptor 120 to a desired temperature value.

A susceptor guide 128 may be provided around the susceptor 120 to guide the susceptor 120. The susceptor guide 128 may be formed of an insulating material, e.g., ceramic or quartz.

A lift pin may be embedded in the susceptor 120 to support and elevate the substrate W. The lift pin may be configured to move vertically through a penetration hole formed in the susceptor 120 and protrude from a top surface of the susceptor 120. In one embodiment, three or more lift pins may be provided to support the substrate W.

An exhaust space 130 may be formed around the perimeter of the susceptor 120 (e.g., to circumferentially enclose the susceptor 120). An annular baffle plate 131, in which a plurality of exhaust holes (not shown) are formed, may be provided at a top side or in an upper portion of the exhaust space 130 (e.g., so as to be arranged around the perimeter of the susceptor 120). The baffle plate 131 may uniformly exhaust a gaseous material within the hydrogen plasma annealing treatment apparatus 100. The baffle plate 131 may be formed of a single layer or stacked two or more layers. For example, the baffle plate 131 may be formed of two stacked layers, such as layers 131a and 131b.

An exhaust line 132 may be connected to the exhaust space 130 at a bottom side of the exhaust space 130. The bottom side of the exhaust space 130 may correspond to a bottom surface of the hydrogen plasma annealing treatment apparatus 100. Although the hydrogen plasma annealing treatment apparatus 100 is illustrated as including only one exhaust line 132, it will be appreciated that any number of exhaust lines 132 may be included. For example, a plurality of exhaust lines 132 may be arranged around the perimeter of the susceptor 120. The exhaust line 132 may be connected to, for example, an exhaust apparatus 133 that includes a vacuum pump. The exhaust apparatus 133 may be configured to reduce a pressure within the hydrogen plasma annealing treatment apparatus 100 to a predetermined vacuum level.

A radio frequency (RF) antenna apparatus 140, which supplies microwave radiation to generate plasma, may be provided at a top side of the dome 141. The RF antenna apparatus 140 may include a slot plate 142, a slow-wave plate 143, and a shield lid 144.

The dome 141 may be formed of an insulating material that is transparent to microwave radiation, e.g., quartz, $Al_2O_3$, AlN, $Y_2O_3$ or the like. The dome 141 may be coupled to the dome plate 118 using a sealing member such as an O-ring.

The slot plate 142 may be placed on the top side of the dome 141 (e.g., opposite to the susceptor 120). The slot plate 142 may include a plurality of slots formed therein and may function as an antenna. The slot plate 142 may be formed of a conductive material (or a metal), e.g., copper, aluminium, nickel, or the like.

The slow-wave plate 143 may be disposed on the slot plate 142 and may function to reduce a wavelength of the microwave radiation. The slow-wave plate 143 may be formed of an insulating material (or a low loss dielectric material), e.g., quartz, $Al_2O_3$, AlN, or $Y_2O_3$, or the like.

The shield lid 144 may be disposed on the slow-wave plate 143 to cover the slot plate 142 and the slow-wave plate 143. A plurality of circulation-type flow paths, through which coolant can flow, may be provided within the shield lid 144. The dome 141, the slow-wave plate 143, and the shield lid 144 may be cooled to a predetermined temperature by controlling characteristics of the coolant flowing through the coolant flow paths (e.g., flow rate, temperature, etc.).

A coaxial waveguide 150 may be connected to a central portion of the shied lid 144. The coaxial waveguide 150 may include an inner conductor 151 and an outer conductor 152. The inner conductor 151 may be connected to the slot plate 142. The inner conductor 151 may be conically widened at an end portion that is connected to the slot plate 142, and may be configured to efficiently transmit the microwave radiation to the slot plate 142.

The coaxial waveguide 150 may be sequentially connected to a mode converter 153, which converts the microwave into a predetermined oscillation mode, to a rectangular waveguide 154, and to a microwave generator 155. The microwave generator 155 may generate microwave radiation with a predetermined frequency, e.g., 2.45 GHz or thereabout. A power of about 2000 W or more may be applied to the microwave generator 155. For example, the power in a range from about 3000 W to about 3500 W may be applied to the microwave generator 155.

A method of generating plasma in the hydrogen plasma annealing treatment apparatus 100 may be a capacitive type or an inductive type. Alternatively, the hydrogen plasma annealing treatment apparatus 100 may be connected to a remote plasma generator such as a plasma tube.

Constructed as exemplarily described above, microwave radiation generated by the microwave generator 155 may sequentially pass through the rectangular waveguide 154, the mode convertor 153, and the coaxial wave guide 150 to be transmitted into the RF antenna apparatus 140. At the RF antenna apparatus 140, the wavelength of the transmitted microwave radiation, may be converted into a short wavelength through compression by the slow-wave plate 143. Thereafter, circularly polarized microwave radiation generated by the slot plate 142 may be emitted from the slot plate 142 to penetrate into the reaction space 182 through the dome 141. In the reaction space 182, a treatment gas may turn into plasma by the microwave radiation, thereby performing a plasma treatment on the substrate W.

Herein, the RF antenna apparatus 140, the coaxial waveguide 150, the mode convertor 153, the rectangular waveguide 154, and the microwave generator 155 may constitute a "plasma generator."

A first gas supply line 160, for supplying a gas provided from a first gas supply source 161, may be provided at a central portion of the RF antenna apparatus 140. The first gas supply line 160 may pass through the RF antenna apparatus 140. The first gas supply line 160 may have a first end portion which passes through the dome 141 and is open. The first gas supply 160 may pass through the inner conductor 151 of the coaxial waveguide 150 and the mode convertor 153, and may have a second end portion which is connected to a first gas supply source 161. The first gas supply source 161 may contain a gas such as hydrogen ($H_2$), or the like. In some embodiments, the first gas supply source 161 may contain one or more inert gases (e.g., helium, neon, argon, etc.), one or more nitrogen-based gases (e.g., nitrogen ($N_2$), ammonia ($NH_3$), hydrazine ($N_2H_4$), etc.) or the like, or any combination thereof. The first gas supply source 161 may contain any of such inert or nitrogen-based gases instead of, or in addition to, hydrogen ($H_2$). A first supply control member 162, such as a valve and/or a flow rate controller which controls a flow of the gas, may be installed in the first gas supply line 160. The first gas supply line 160, the first gas supply source 161, and the first supply control member 162 may constitute a "first gas supply unit."

As illustrated in FIG. 2, a second gas supply line 170 for supplying the gas and a third gas supply line 190 for supplying the gas may be provided at a sidewall of the chamber housing 180. Although the hydrogen plasma annealing treatment apparatus 100 is illustrated as including only one second gas supply line 170 and only one third gas supply line 190, it will be appreciated that any number of second gas supply lines 170 and third gas supply lines 190 may be provided. For example, twenty-four second gas supply lines 170 and third gas supply lines 190 may be circumferentially within the sidewall of the chamber housing 180. In one embodiment, the plurality of the second supply lines 170 and the plurality of the third supply lines 190 may be arranged at regular intervals about the perimeter of the chamber housing 180. Each of the second supply line 170 and the third gas supply line 190 may have a first end portion which is open (e.g., so as to be in fluid communication with the reaction space 182) and a second end portion connected to a corresponding one of first and second buffer members 171 and 191.

The first buffer member 171 may be installed in the sidewall of the chamber housing 180 (e.g., along the perimeter of the chamber housing 180), and be commonly connected to the plurality of the second gas supply lines 170. The first buffer member 171 may be connected to a second gas supply source 173 via a first supply line 172. The second gas supply source 173 may contain one or more inert gases (e.g., helium, neon, argon, etc.), one or more nitrogen-based gas (e.g., nitrogen ($N_2$), ammonia ($NH_3$), hydrazine ($N_2H_4$), etc.), or the like or any combination thereof. In addition, a second supply control member 174, such as a valve and/or a flow rate controller which controls a flow of the gas, may be installed in the first supply line 172. As illustrated in FIG. 2, gas supplied from the second gas supply source 173 may be introduced into the first buffer member 171 via the first supply line 172, and may be supplied into the chamber housing 180 via the second gas supply line 170 (e.g., after a flow rate or a pressure of the gas is controlled in the first buffer member 171 to be uniform along a circumferential direction). The second gas supply line 170, the first buffer member 171, the first supply line 172, the second gas supply source 173, and the second supply control member 174 may constitute a "second gas supply unit."

The second buffer member 191 may be installed in the sidewall of the chamber housing 180 (e.g., along the perimeter of the chamber housing 180), and be commonly connected to the plurality of the third gas supply lines 190. The second buffer member 191 may be connected to a third gas supply source 193 via a second supply line 192. The third gas supply source 193 may contain one or more inert gases (e.g., helium, neon, argon, etc.), one or more nitrogen-based gases (e.g., nitrogen ($N_2$), ammonia ($NH_3$), hydrazine ($N_2H_4$), etc.), or the like or any combination thereof. In addition, a third supply control member 194, such as a valve and/or a flow rate controller which controls a flow of the second gas, may be installed in the second supply line 192. As illustrated in FIG. 2, gas supplied form the third gas supply source 193 may be introduced into the second buffer member 191 via the second supply line 192, and may be supplied into the chamber housing 180 via the third gas supply line 190 (e.g., after a flow rate or a pressure of the gas is controlled in the second buffer member 191 to be uniform along a circumferential direction). The third gas supply line 190, the second buffer member 191, the second supply line 192, the third gas supply source 193, the third supply control member 194 may constitute a "third gas supply unit."

In one embodiment, the gases supplied from the first, second and third gas supply sources 161, 173 and 193, respectively, may be a nitrogen-based gas, an inert gas and hydrogen ($H_2$), respectively. In other embodiments, however, the first, second and third gas supply sources 161, 173 and 193 may supply different types of gases.

A controller 301 may be provided to control supply and distribution of the gases from the first, second and third gas supply source 161, 173 and 193, to control the operation of the microwave generator 155, and to control an on/off operation of a gate valve 113 permitting transfer of the substrate W into the reaction space 182.

In the hydrogen plasma annealing treatment apparatus 100, various parts formed of insulating material such as quartz may be exposed to the reaction space 182. When the hydrogen plasma process is performed, the exposed parts may react with hydrogen radicals, thereby generating particles. As a result, a life of such various parts may become shortened.

Figure 3:
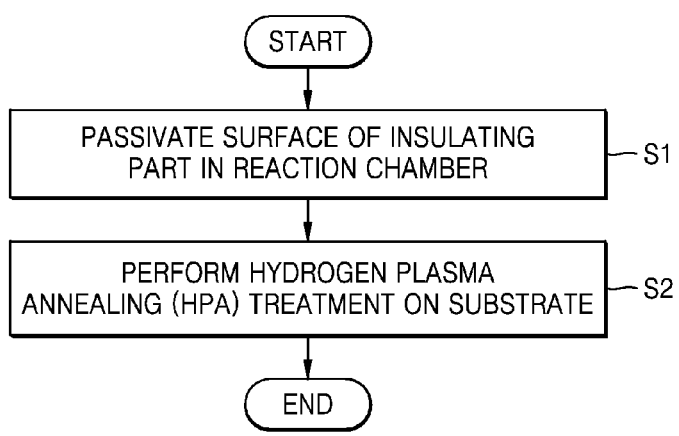
FIG. 3 is a flow chart illustrating a method for performing a surface treatment according to an example embodiment.

FIG. 3 is a flow chart illustrating a method for performing a surface treatment according to an example embodiment.

Referring to FIGS. 2 and 3, surfaces of insulating parts exposed to the reaction space 182 may be passivated (S1). The insulating parts may, for example, include the dome 141 of the chamber housing 180, the sidewall liner 184, the baffle plate 131, the susceptor 120, or the like or any combination thereof. At least one of the insulating parts may be formed of a material such as quartz, $Al_2O_3$, AlN, $Y_2O_3$, or the like.

Figure 4:
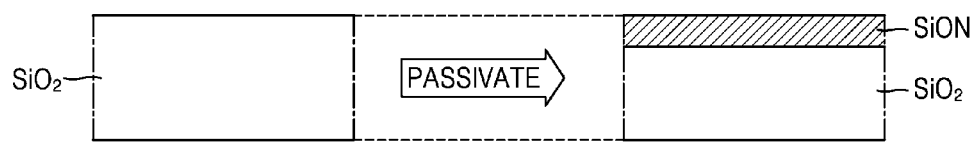
FIG. 4 is a schematic view illustrating a change of a surface of each of insulating parts in a reaction chamber by a passivation treatment.

FIG. 4 is a schematic view illustrating a change of the surface of the insulating part by the passivation treatment S1. Although FIG. 4 illustrates the case in which the insulating part is formed of quartz, it should be recognized that the passivation treatment S1 may be applied to any insulating part formed of another insulating material such as $Al_2O_3$, AlN, or $Y_2O_3$, or the like.

Referring to FIG. 4, at least a portion of a surface of an insulating part formed of quartz (also referred to herein as a "quartz part") may be converted into a silicon oxynitride (SiON) layer (or may be nitrified, or passivated). In other words, the silicon oxynitride layer may not be a layer deposited on the quartz part as a new layer, but rather a portion of the surface of the quartz part may be converted into a silicon oxynitride layer having a certain thickness by the passivation treatment. Herein, nitrogen (N) may be provided by the nitrogen-based gas used in the passivation treatment and the other elements, i.e., silicon (Si), oxygen (O) may be provided by the quartz in the quartz part.

Referring again to FIGS. 2 and 3, a hydrogen plasma annealing (HPA) treatment may be performed on the substrate W (S2). When performed on the substrate W, the HPA treatment can also be performed on the insulating part with the SiON passivation layer thereon, the SiON layer may be converted in silicon oxide ($SiO_2$) layer. The steps (or operations) described above will be described in greater detail below.

Figure 5:
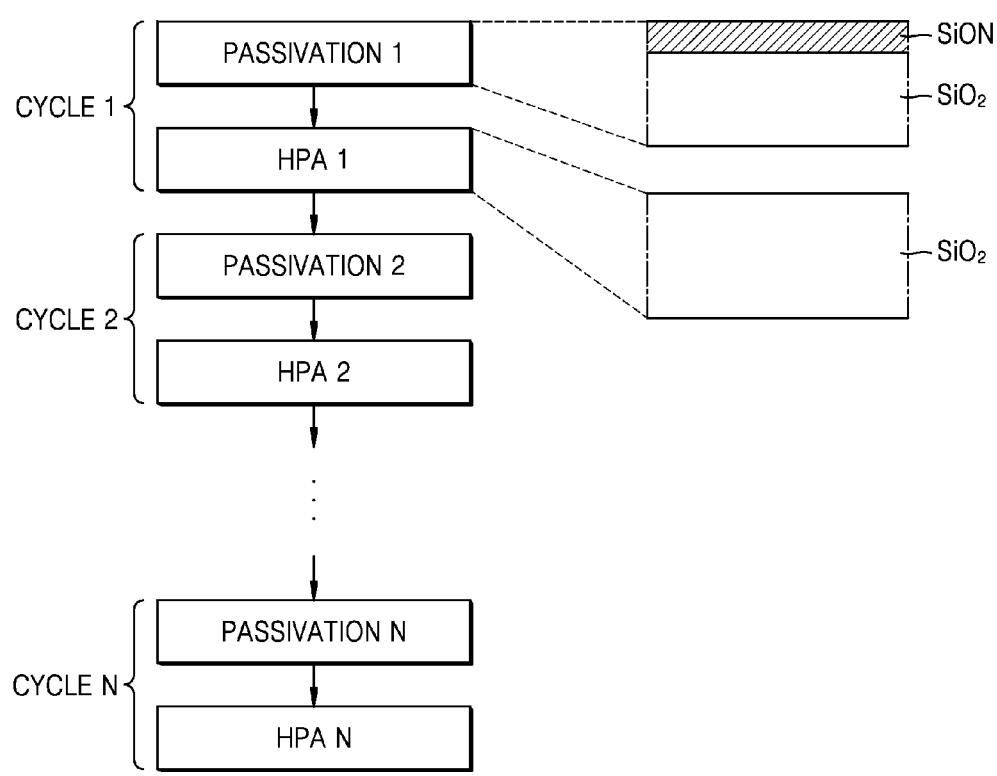
FIGS. 5 through 7 are schematic views explaining combinations of treatment steps in a method for performing a surface treatment according to some example embodiments.
Figure 6:
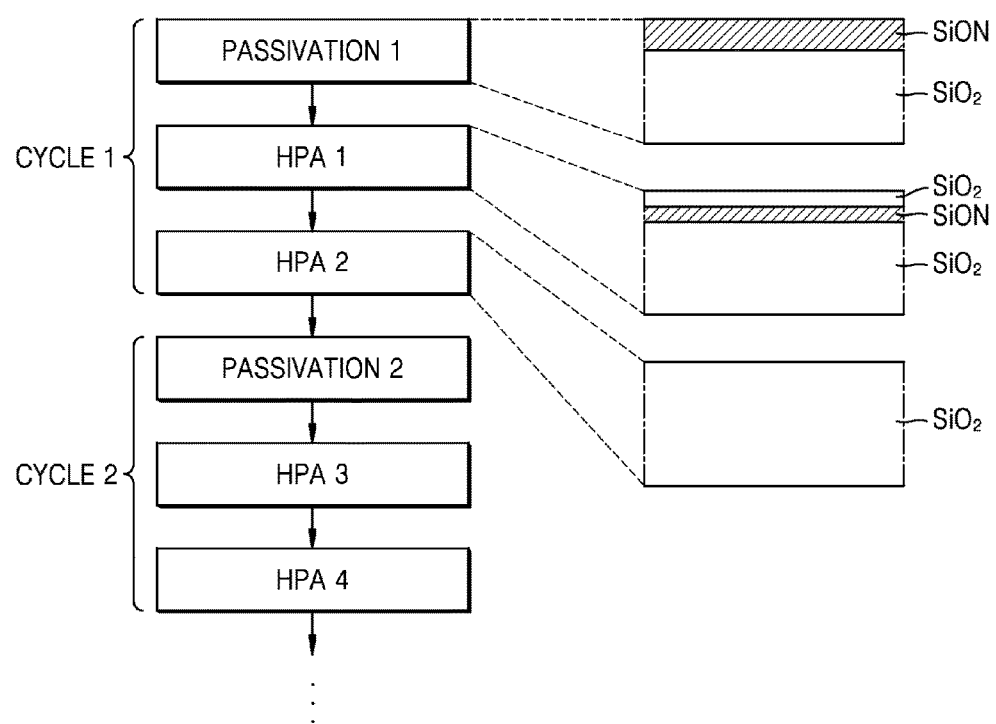
Figure 7:
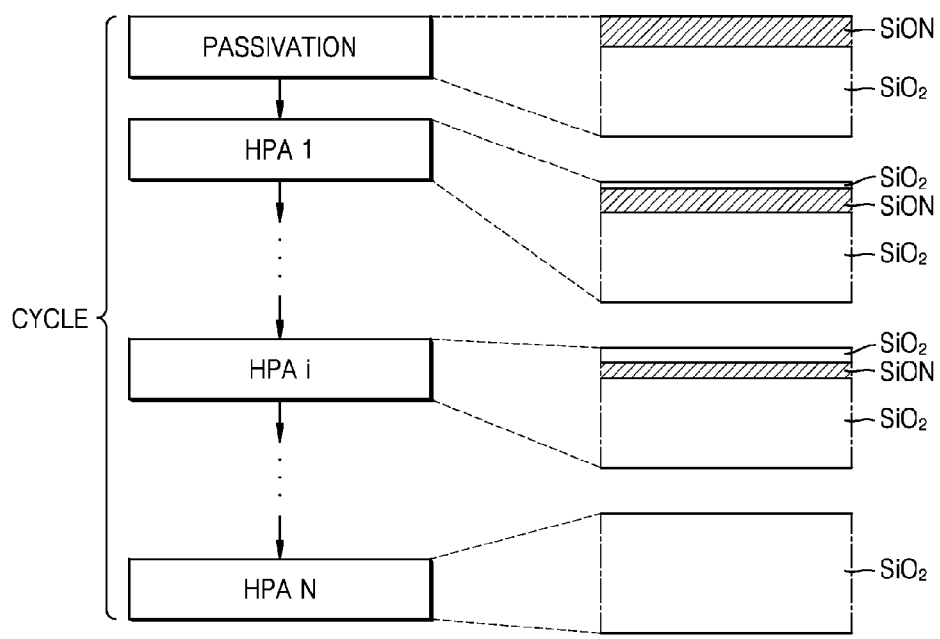

FIGS. 5 through 7 are schematic views explaining combinations of steps in a method for performing a surface treatment according to an example embodiment.

Referring to FIG. 5, a passivation treatment may be carried out once, prior to each hydrogen plasma annealing (HPA) treatment. The passivation treatment (or process) may convert at least partially convert the surface of the insulating part (e.g., a quartz part) into a passivation layer (e.g., a silicon oxynitride (SiON) layer).

The number of times the passivation treatment is carried out may be substantially the same as the number of times the HPA treatment is performed. A thickness of a silicon oxynitride (SiON) layer formed in a single passivation treatment may be substantially the same as that of a silicon oxide ($SiO_2$) layer formed in a single HPA treatment. In this case, performing the passivation treatment once and performing the single HPA treatment once may constitute one cycle (also referred to herein as a "treatment cycle." A silicon oxynitride (SiON) layer can be considered to have substantially the same thickness as a silicon oxide ($SiO_2$) layer if there is slight thickness variation between the two layers attributable to the presence of nitrogen in the silicon oxynitride (SiON) layer (or by the absence of nitrogen in the silicon oxide ($SiO_2$) layer). A silicon oxynitride (SiON) layer is not considered to have substantially the same thickness as a silicon oxide ($SiO_2$) layer if the cause for the thickness variation between the two layers is not attributable to the presence of nitrogen in the silicon oxynitride (SiON) layer (or by the absence of nitrogen in the silicon oxide ($SiO_2$) layer).

Referring to FIG. 6, within a single treatment cycle, an HPA treatment may be performed twice and a passivation treatment may be performed once. For example, in a first treatment cycle, a first HPA treatment 1 and a second HPA treatment 2 may be performed after performing a first passivation treatment 1 and, in a second treatment cycle, a third HPA treatment and a fourth HPA treatment 4 may be performed after a second passivation treatment 2. Furthermore, within an $n^{th}$ treatment cycle, a $2n-1^{th}$ HPA treatment 2N-1 and a $2n^{th}$ HPA treatment 2N may be performed after an $n^{th}$ passivation treatment N. Within a treatment cycle as shown in FIG. 6, a thickness of the silicon oxynitride (SiON) layer formed in a single passivation treatment may be twice the thickness of a silicon oxide ($SiO_2$) layer formed in a single HPA treatment. In this case, a treatment cycle may be performed by performing the passivation treatment once and performing the HPA treatment two times.

Referring to FIG. 7, in a single treatment cycle, n HPA treatments may be performed after performing a single passivation treatment. For example, a first HPA treatment 1, . . . an $i^{th}$ HPA treatment i (where "i" is an integer greater than 1), . . . , and an $n^{th}$ HPA treatment N (where "n" is an integer greater than i) may be performed after performing a single passivation treatment. Within a cycle as shown in FIG. 7, a thickness of the silicon oxynitride (SiON) layer formed in a single passivation treatment may be n times a thickness of a silicon oxide (SiO$_2$) layer formed in a single HPA treatment. In this case, a treatment cycle may be performed by performing the passivation treatment once and performing the HPA treatment n times (e.g., where n is greater than 2).

As shown as FIGS. 6 and 7, in one treatment cycle, the number of times a silicon oxynitride (SiON) layer is formed by converting a portion of a surface of a quartz part (i.e., the number of times the passivation treatment is performed) may be less than the number of times an HPA treatment is performed on a substrate W loaded in the hydrogen plasma annealing treatment apparatus 100. For example, a ratio of the number of times a passivation treatment is performed to the number of times an HPA treatment is performed on the loaded substrate W may be in a range from 1:2 to 1:2.5.

Hereinafter, the step of passivating the surfaces of the insulating parts in the chamber housing 180 of FIG. 2 (i.e., S1 in FIG. 3) will be described in more detail.

Figure 8:
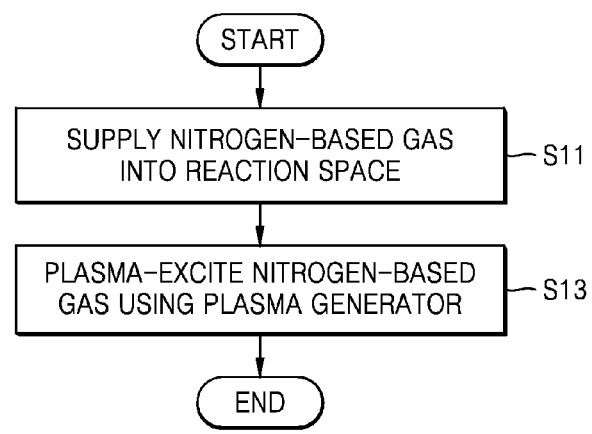
FIG. 8 is a flow chart illustrating a method of passivating surfaces of insulating parts in a reaction chamber, according to an example embodiment.

FIG. 8 is a flow chart illustrating a method of passivating the surfaces of the insulating parts in the reaction chamber, according to an example embodiment.

Referring to FIGS. 2 and 8, the nitrogen-based gas may be supplied into the reaction space 182 (S11). The nitrogen-based gas may be supplied through any one of the first gas supply line 160, the second gas supply line 170, and the third gas supply line 190. Herein, as an example, the nitrogen-based gas may be supplied through the first gas supply line 160. Thus, the controller 301 may be configured to block the third gas supply line 190 for supplying the hydrogen gas while the nitrogen-based gas is supplied into the reaction space 182 through the first gas supply line 160.

The nitrogen-based gas may include a gas such as N$_2$, ammonia (NH$_3$), hydrazine (N$_2$H$_4$), plasma N$_2$, remote plasma N$_2$, or the like or any combination thereof. The nitrogen-based gas may include nitrogen, but may not include oxygen. For example, the nitrogen-based gas may not include a gas such NO, NO$_2$, or N$_2$O. The nitrogen-based gas may be supplied at a flow rate of about 200 sccm to about 5000 sccm.

An inert gas may be supplied into the reaction space 182 through any one of the first gas supply line 160, the second gas supply line 170, and the third gas supply line 190. The gas supply line through which the inert gas is supplied may be different from that through which the nitrogen-based gas is supplied. For example, the inert gas may be supplied through the second gas supply line 170. Thus, the controller 301 may be configured to supply the inert gas into the reaction space 182 through the second gas supply line 170 while the nitrogen-based gas is supplied into the reaction space 182 through the first gas supply line 160.

The inert gas may include a gas such as helium, neon, argon, or the like or any combination thereof. The inert gas may be supplied at a flow rate of about 100 sccm to about 10000 sccm.

Hydrogen (H$_2$) gas may not be supplied into the reaction space 182. Further, oxygen-based gas may not be supplied into the reaction space 182. Examples of oxygen-based gases include O$_3$, H$_2$O, O$_2$, NO$_2$, NO, N$_2$O, H$_2$O, alcohol, metal alkoxide, plasma O$_2$, remote plasma O$_2$, plasma N$_2$O, plasma H$_2$O, or the like or a combination thereof.

The substrate W may not always be present in the reaction space 182 when the surface treatment (or any passivation treatment or the HPA treatment thereof) is performed. For example, the substrate W may not be loaded in the reaction space 182, or may be taken out to the outside since the surface treatment has been already finished.

The nitrogen-based gas supplied into the reaction space 182 at S11 may be plasma-excited using the plasma generator (S13). To plasma-excite the nitrogen-based gas, the control 301 may be configured to apply a power of about 1000 W to about 3000 W to the plasma generator. In some embodiments, a power of more than 3000 W, for example, about 3000 W to about 4000 W may be applied.

In this step, a temperature of the reaction space 182 may be in a range from about 450° C. to about 650° C. Further, a pressure within the reaction space 182 may be in a range from about 10 mTorr to about 150 mTorr. In some embodiments, the plasma-excitation may be made at a pressure of more than 150 mTorr or at a pressure of less than 10 mTorr.

As described above, when the plasma generator is started, the nitrogen-based gas may be excited to react with surfaces of the insulating parts of the chamber housing 180 that are exposed to the reaction space 182. The surfaces of the insulating parts may be at least partially formed of quartz, Al$_2$O$_3$, AlN, Y$_2$O$_3$, or the like or any combination thereof. In the case where the insulating parts are formed of quartz, at least a portion of the surface of each of the insulating parts may be converted into a SiON layer. Herein, SiO$_2$ and SiON may not be chemical formulae which are stoichiometrically represented.

The SiON layer may be referred to as a passivation layer. The SiON layer may have a thickness in a range from about 10 Å to about 40 Å. The thickness of the SiON layer may be increased according to progress of the nitrogen plasma treatment. However, because a distance to which nitrogen passes through the SiON layer from the surfaces of the insulating parts is increased according to progress of the nitrogen plasma treatment, a growth rate of the thickness of the SiON layer may be reduced as the duration of the nitrogen plasma treatment increases. Thus, the nitrogen plasma treatment may be sustained for a duration in a range from about 10 seconds to about 10 minutes, and preferably in a range from about 20 seconds to about 1 minute. The insulating parts may, for example, include the dome 141, the sidewall liner 184, the baffle plate 131, the susceptor 120, or the like or any combination thereof. When the nitrogen plasma treatment in the reaction space 182 is finished, the reaction space 182 may be evacuated by the exhaust apparatus 133, or may be purged with a purge gas.

Hereinafter, a method of performing the hydrogen plasma annealing (HPA) treatment on the substrate W in the chamber housing 180 will be described in more detail.

Figure 9:
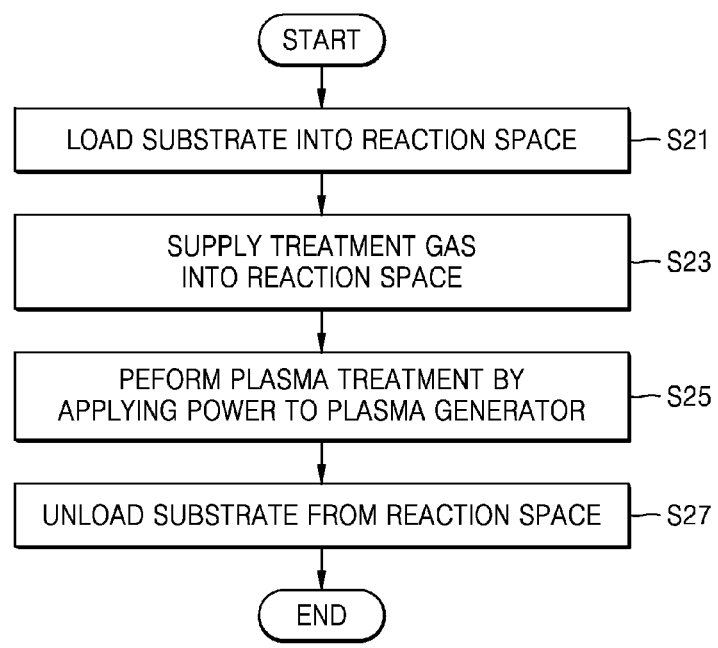
FIG. 9 is a flow chart illustrating a method of performing a surface treatment on a substrate in a reaction chamber according to an example embodiment.

FIG. 9 is a flow chart illustrating a method of performing the hydrogen plasma annealing treatment on a substrate in a reaction chamber according to an example embodiment.

Figure 10:
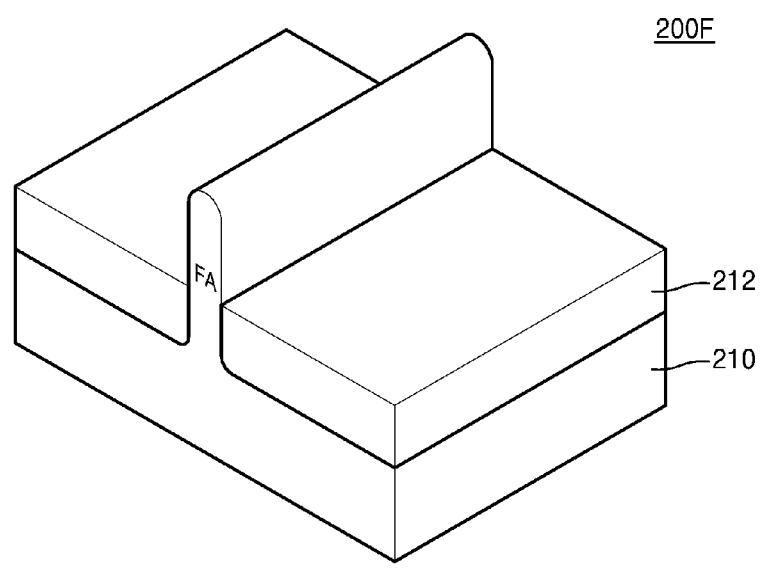
FIG. 10 is a perspective view illustrating a structure on a substrate to be treated in a plasma treatment apparatus according to an example embodiment.

Referring to FIGS. 2 and 9, the substrate W may be loaded into the reaction space 182 through the gate valve 113 (S21). The controller 301 may be configured to open the gate valve 113 to allow the substrate W to be loaded into the reaction space 182 and may be configured to place the substrate on the susceptor 120. The loaded substrate W may be a semiconductor substrate on which a structure for manufacturing a semiconductor device is formed. FIG. 10 is a perspective view illustrating such a structure 200F.

Referring to FIG. 10, a semiconductor substrate 210 on which a fin type active region FA is formed may be provided. The semiconductor substrate 210 may include a semiconductor material such as Si or Ge, a semiconductor compound such as SiGe, SiC, GaAs, InAs, or InP, or the like or any combination thereof. In some embodiments, the semiconductor substrate 210 may include a III-V group semiconductor material and a IV group semiconductor material. The III-V group semiconductor material may include a binary compound, a ternary compound, or a quaternary compound, each of which containing at least one III group element and at least one IV group element. The III-V group semiconductor material may be a semiconductor compound including at least one III group element (e.g., In, Ga, Al, etc.), at least one V group element (e.g., As, P, Sb, etc.). For example, the III-V group semiconductor material may include, for example, InP, $In_zGa_{1-z}As$ ($0 \le z \le 1$), or $Al_zGa_{1-z}As$ ($0 \le z \le 1$). The binary compound may include, for example, InP, GaAs, InAs, InSb, or GaSb. The ternary compound may include, for example, InGaP, InGaAs, AlInAs, InGaSb, GaAsSb or GaAsP. The IV group semiconductor material may include, for example, Si or Ge. However, the III-V or IV group semiconductor materials are not limited thereto. The III-V group semiconductor material and the IV group semiconductor material such as Ge may be used as a channel material to manufacture a low power and high-speed transistor. A high performance transistor (e.g., a high performance CMOS transistor) may formed using a III-V group semiconductor substrate (or a III-V group semiconductor material) including, for example, GaAs, which has an higher electron mobility than a silicon substrate and a IV group semiconductor material including, for example, Ge, which has a higher hole mobility than a silicon substrate.

In some embodiments, when an NMOS transistor is formed on the semiconductor substrate 210, the semiconductor substrate 210 may include any one of the III-V group semiconductor materials as described above. In some embodiments, when a PMOS transistor is formed on the semiconductor substrate 210, at least a portion of the semiconductor substrate 210 may include Ge. In some embodiments, the semiconductor substrate 210 may include a silicon-on-insulator (SOI) substrate. The semiconductor substrate 210 may include a conductive region, for example, a well doped with dopants, or a structure doped with dopants.

A device isolation layer 212 may be provided on sidewalls of the fin type active region FA to isolate the fin type active region FA from adjacent fin type active region FA.

In some embodiments, the device isolation layer 212 may include a silicon oxide layer, a silicon nitride layer, a silicon oxynitride layer, a silicon carbonitride layer, a poly-silicon layer, or the like or a combination thereof. The device isolation layer 212 may be formed by a plasma enhanced chemical vapor deposition (PECVD) process, a high density plasma chemical vapor deposition (HDP CVD) process, an inductively coupled plasma chemical vapor deposition (ICP CVD) process, a capacitor coupled plasma chemical vapor deposition (CCP CVD) process, a flowable chemical vapor deposition (FCVD) process, a spin coating process, or the like or any combination thereof. In one embodiment, the device isolation layer 212 may be formed of fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PETEOS), tonen silazene (TOZ), or the like or any combination thereof.

Referring again to FIGS. 2 and 9, the substrate W, e.g., the substrate 210 with the structure 200F of FIG.10, may be disposed on the susceptor 120 by the lift pin. The substrate W may be electrostatically adhered to the electrostatic chuck 121 by applying a direct current to the electrode 122 of the electrostatic chuck 121 (e.g., by turning on the direct current power supply 123). After the gate valve 113 is shut down to hermetically seal the reaction space 182, the exhaust apparatus 133 may be operated to decompress the reaction space 182 to a predetermined pressure, e.g., to a pressure in a range from about 10 mTorr to about 500 mTorr. A temperature of the substrate W may be increased to a temperature in a range from about 450° C. to about 650° C. using the heater/cooler 126 in the susceptor 120.

A treatment gas (e.g., hydrogen ($H_2$) gas) may be supplied into the reaction space 182 (S23). The hydrogen gas may be supplied through at least one of the first gas supply line 160, the second gas supply line 170, and the third gas supply line 190. However, the hydrogen gas may not be supplied through gas supply lines through which nitrogen based gas and/or inert gas has been supplied, but rather may be supplied through the other gas supply line. For example, the hydrogen gas may be supplied through the third gas supply line 190. The controller 301 may be configured to block the first gas supply line 160 while supplying the hydrogen gas into the reaction space 182 through the third gas supply line 190. The hydrogen ($H_2$) gas may be supplied from the third gas supply line 190 at a flow rate of about 750 sccm. Further, argon (Ar) gas may be supplied from the second gas supply line 170 at a flow rate of about 100 sccm.

When the argon gas and the hydrogen gas are supplied, the controller 301 may be configured to operate the microwave generator 155 by applying a power (e.g., a power of about 1000 W to about 3500 W) such that the microwave generator 155 generates microwave radiation of a predetermined power at a frequency of e.g., 2.45 GHz (S25). For example, the microwave radiation may be emitted into the reaction space 182 through the rectangular waveguide 154, the mode convertor 153, the coaxial waveguide 150, and the RF antenna apparatus 140. The supplied gas (e.g., Ar, $H_2$) may be plasma-excited by the microwave radiation and may be dissociated to generate a plasma containing active species, thus the substrate W may be treated with the plasma by the active species. In other words, the hydrogen plasma annealing treatment is performed on the substrate W. The hydrogen plasma annealing treatment is performed on the substrate W in a range from about 10 seconds to about 10 minutes, and preferably, in a range from about 20 seconds to about one minute. While the plasma treatment is performed on the substrate W, a high frequency wave power may further be applied so as to output a high frequency wave of a predetermined power at e.g., a frequency of 13.56 MHz.

Although a plasma treatment (or the plasma annealing treatment) using microwave radiation has been described above, a plasma treatment using any other suitable type of radiation may be used. For example, the plasma treatment (i.e., the hydrogen plasma annealing treatment) using a high frequency wave power may be applied to the example embodiments described herein.

In addition, although the embodiments discussed herein have related to a plasma treatment such as the aforementioned hydrogen plasma annealing treatment, the embodiments discussed herein may be applied to a substrate treatment other than the hydrogen plasma annealing treatment, (e.g., a plasma treatment for an etching process, a sputtering process, or a deposition process). In some embodiments, a substrate to be treated by the plasma treatment may include, for example, a sapphire substrate, a glass substrate, an organic electroluminescent (EL) substrate, a substrate for a flat panel display (FPD).

When the fin type active region FA is patterned on the substrate W (e.g., the substrate 210), a roughness and a crystal disorder may exist on a surface of the fin type active region FA. As a result, carrier mobility may be reduced due to the roughness and the crystal disorder. However, the roughness and/or the crystal disorder of the substrate W generated in the patterning process may be removed (or cured) by performing the hydrogen plasma annealing treatment.

After the hydrogen plasma annealing treatment is performed, the substrate W may be unloaded from the reaction space 182 (S27) (e.g., by a means such as a robot arm).

Figure 11:
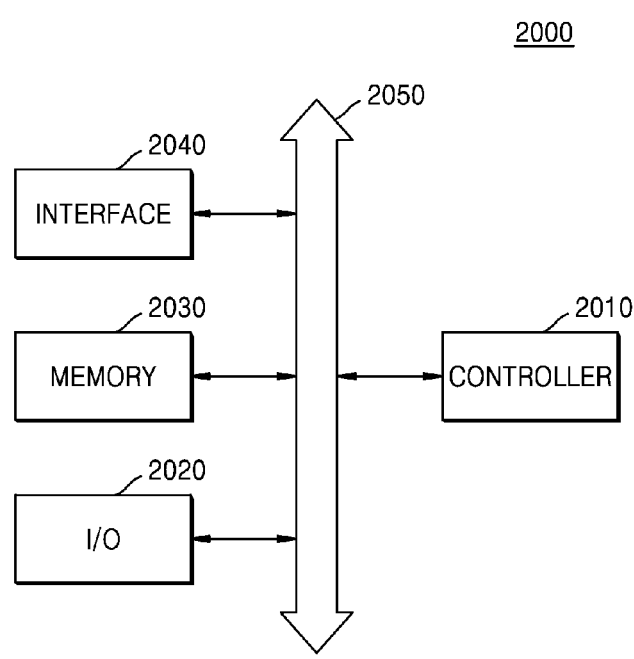
FIG. 11 is a block diagram illustrating an electronic system according to example embodiments.

FIG. 11 is a block diagram illustrating an electronic system according to example embodiments of the inventive concept.

Referring to FIG. 11, an electronic system may include a controller 2010, an input/output (I/O) unit 2020, a memory device 2030, an interface unit 2040, and a data bus 2050. At least two of the controller 2010, the I/O unit 2020, the memory device 2030, and the interface unit 2040 may communicate with each other through the data bus 2050.

The controller 2010 may include at least one of a microprocessor, a digital signal processor, a microcontroller, or other logic devices having a similar function to any one thereof. The I/O unit 2020 may include a keypad, a keyboard and/or a display unit. The memory device 2030 may be used to store commands executed by the controller 2010. The memory device 2030 may store user data.

The electronic system 2000 may form a wireless communication device, or a device capable of transmitting and/or receiving information under wireless environments. The interface 2040 may be implemented by a wireless interface in order to help the electronic system 2000 to transmit/receive data via a wireless communication network. The interface 2040 may include an antenna and/or a wireless transceiver. According to some embodiments, the electronic system 2000 may be used in a communication interface protocol of a third-generation communication system, for example, code division multiple access (CDMA), a global system for mobile communications (GSM), north American digital cellular (NADC), extended-time division multiple access (E-TDMA), and/or wide band code division multiple access (WCDMA). The electronic system 1100 may include at least one semiconductor device manufactured using the methods of the plasma annealing treatment as described with reference to FIGS. 3 to 9

Hereinafter, configurations and effects of the embodiments discussed above will be described in detail using an experimental example, example embodiments and comparative examples. The experimental examples and example embodiments are intended to merely clarify concepts introduced in the embodiments discussed above, not to limit the scope of the disclosed embodiments.

<Experimental Example 1>

After a passivation treatment was performed in a reaction chamber with a quartz ($SiO_2$) part exposed therein, a change in the surface of the quartz part, according to progress of a hydrogen plasma annealing treatment, was observed. The passivation treatment was performed by applying a plasma power of 1800 W to 2700 W using a combination of nitrogen and argon. The hydrogen plasma annealing treatment was performed after the passivation treatment was finished.

Figure 12:
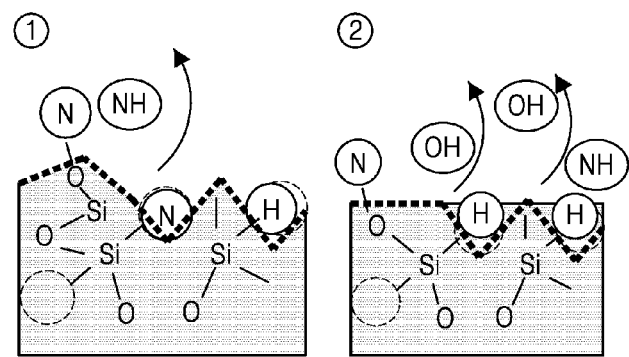
FIG. 12 is a schematic diagram representing a change of a passivated quartz part according to periods of time under a surface treatment in an experimental example.

FIG. 12 is a schematic diagram representing a change of the passivated quartz part as a function of the duration that the hydrogen plasma annealing treatment was performed according to Experimental Example 1.

First Period of Time ①

Referring to FIG. 12, a SiON layer was formed on the passivated quartz part by bonding nitrogen atoms with oxygen atoms in $SiO_2$. When the hydrogen plasma is applied during the hydrogen plasma annealing treatment, the nitrogen atoms bonded with the oxygen atoms may easily dissociate from the oxygen atoms and react with hydrogen radicals to form NH* (i.e., NH radicals) having a N-H bond. When the nitrogen atoms dissociate from the oxygen atoms, the surface of the quartz part may be returned to a previous state before the passivation (e.g., $SiO_2$).

Second Period of Time ②

Meanwhile, when the nitrogen in the SiON layer is entirely exhausted (or removed) to convert SiON into $SiO_2$, the oxygen atoms in $SiO_2$ may become dissociated and react with the hydrogen radicals to form OH*. As a result, the oxygen in $SiO_2$ may be removed, thereby resulting in a damage of the quartz part.

Figure 13:
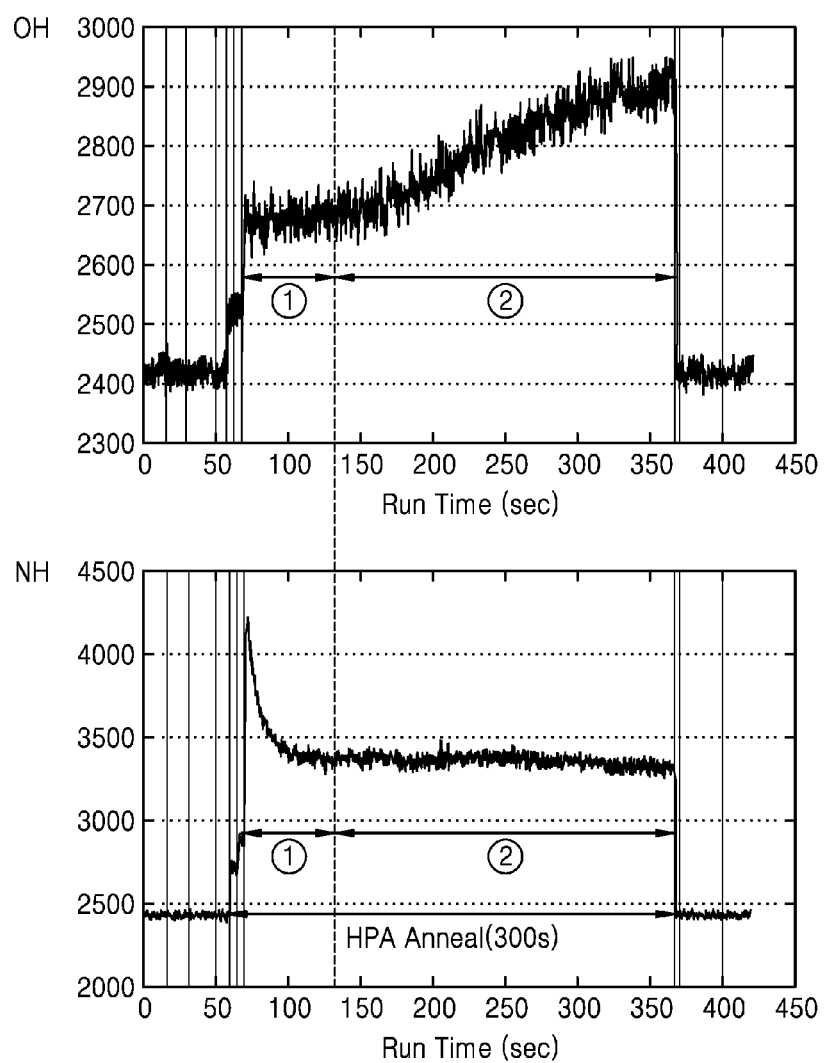
FIG. 13 is a graph representing results observed through an optical emission spectrometry (OES) with respect to a change of an atmosphere in a reaction space according to a first period of time ① and a second period of time ② in the experimental example.

FIG. 13 is a graph representing results observed through an optical emission spectrometry (OES) with respect to a change of an atmosphere in the reaction space 182 during the first period ① and the second period ②.

Referring to FIG. 13, while performing the hydrogen plasma annealing treatment for about 300 seconds, a concentration of OH is initially unchanged for a certain time with respect to a base line and then a period of time in which the concentration of OH uniformly increases is observed. In addition, it is observed that a concentration of NH is initially at a peak level and then is gradually reduced. After a prescribed time is passed, it is observed that the concentration of NH is not significantly changed. The graph shows that a point in time on which the concentration of OH starts to increase is substantially the same as a point in time on which the concentration of NH reaches the base line.

While not wishing to be bound by any particular theory, it is believed that the phenomenon discussed above with respect to FIG. 13 can be explained as a result of the conversion of silicon oxynitride into silicon oxide since the nitrogen in the silicon oxynitride (SiON) layer on the surfaces of the quartz parts is exhausted (or removed) as the hydrogen plasma annealing treatment progresses. For example, at the beginning of the hydrogen plasma-annealing treatment (i.e., at the leftmost end point of the arrow in the NH graph), the concentration of NH rapidly increases until the inside of the reaction chamber and an analysis apparatus reach a stable state. The base line of OH may be stabilized to a prescribed value during this time (see OH graph).

During the first period of time ① after the stabilized interval, the concentration of OH may be kept constant at the base line and the concentration of NH may be monotonously reduced. The concentration of OH is understood to be kept constant at the base line because the nitrogen in the silicon oxynitride (SiON) layer existing on the surface of the quartz part still remains during the first period of time ① and the oxygen boned to silicon has not dissociated in the form of OH*. Furthermore, the concentration of NH is understood to be monotonously reduced because the nitrogen in the silicon oxynitride (SiON) layer existing on the surfaces of the quartz part is gradually exhausted. There is a possibility in which the number of hydrogen radicals bond with nitrogen dissociated from the silicon oxynitride (SiON) layer in the form of NH* is gradually reduced.

Meanwhile, it is observed that, after the first period of time ①, the concentration of OH increases at a substantially constant slope during the second period of time ②. It may be understood that nitrogen in the silicon oxynitride (SiON) layer existing on the surfaces of the quartz part is totally exhausted (or removed) and silicon oxide and the hydrogen radicals readily react with each other. Furthermore, since nitrogen is totally removed, it may be understood that the concentration of NH* in the second period of time ② is kept constant at the base line.

As described above, when the hydrogen plasma annealing treatment time is increased, nitrogen in the silicon oxynitride (SiON) layer may be totally exhausted (or removed). Accordingly, to protect the surface of the quartz part and prevent generation of particles, the passivation treatment time may be controlled to form a silicon oxynitride (SiON) layer having a thickness that corresponds to the hydrogen plasma annealing treatment time required for treating the substrate.

FIGS. 12 and 13 show results of the hydrogen plasma annealing treatment performed for a longer time (e.g., 300 seconds) than the hydrogen plasma annealing treatment time corresponding to the thickness of the passivation (or SiON) layer so as to evaluate the change of the surface of the quartz part according to the duration of the hydrogen annealing treatment. Thus, the results as shown in connection with FIGS. 12 and 13, for example, the phenomena occurred in the second period of time ② may not be occurred in a real process.

Figure 14:
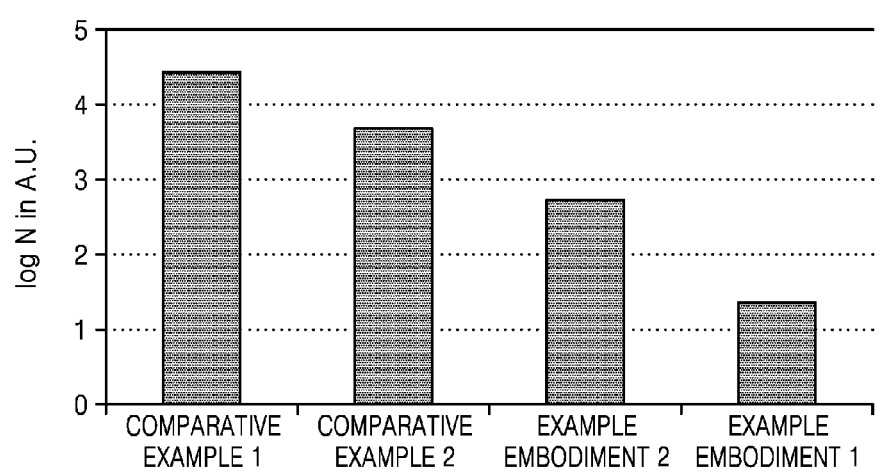
FIG. 14 is a bar graph representing counts of particles in comparative examples and example embodiments.

FIG. 14 is a graph representing a number of particles counted after loading a substrate W (i.e., a silicon wafer) into the reaction chamber and performing a hydrogen plasma annealing treatment.

<Example Embodiment 1>

After a passivation treatment was performed once using nitrogen, a hydrogen plasma annealing treatment was performed once on a loaded substrate W. Thereafter, the number of the surface particles on the silicon wafer was counted.

<Example Embodiment 2>

After a passivation treatment was performed once using nitrogen, a hydrogen plasma annealing treatment was performed 25 times (i.e., a single hydrogen plasma annealing treatment was performed on a single loaded substrate W). Thereafter, the number of the surface particles on the 25$^{th}$ substrate W was counted.

<Comparative Example 1>

A hydrogen plasma annealing treatment was performed on a loaded substrate as discussed in Example Embodiment 1, but the prior passivation treatment was omitted. Thereafter, the number of the surface particles on the substrate W was counted.

<Comparative Example 2>

A hydrogen plasma annealing treatment was performed on a loaded substrate as discussed in Example Embodiment 1, but the prior passivation treatment was performed only once, using oxygen instead of the nitrogen. Thereafter, the number of the surface particles on the substrate W was counted.

FIG. 14 is a bar graph representing a number of particles in the Comparative Examples and the Example Embodiments discussed above. Herein, a vertical axis represents the counts of particles. More particularly, the vertical axis represents a count of particles in a log scale and a relative arbitrary unit (A.U.).

Referring to FIG. 14, the number of the particles created in Comparative Example 1 (i.e., hydrogen plasma annealing treatment performed without a prior passivation treatment) is less than one-fifth of the number of particles created in Comparative Example 2 (i.e., hydrogen plasma annealing treatment performed after an oxygen passivation treatment was performed). However, the number of the particles created in Comparative Example 2 is about 10 times the number of particles created in Example Embodiment 2 (note that the vertical axis is a log scale). It can be seen that the Example Embodiment 1 (i.e., hydrogen plasma annealing treatment performed only once after a single nitrogen passivation treatment was performed) creates fewer particles compared to Comparative Example 2, thereby providing an improved reduction in particle-creation. Furthermore, the number of the particles created in Example Embodiment 2 (i.e., hydrogen plasma annealing treatment performed 25 times after a single nitrogen passivation treatment was performed) is 20 times more than the number of particles created in Example Embodiment 1. In view of the above, it can be seen that the number of particles created can be significantly reduced when a passivation treatment is performed on the insulating part, and that a passivation treatment performed using nitrogen may be more effective in reducing the number of particles created than a passivation treatment performed using oxygen. In addition, when the passivation treatment using nitrogen precedes a hydrogen plasma annealing treatment, the number of particles may also be significantly reduced.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method for preparing a hydrogen plasma annealing treatment, comprising:
   passivating a surface of an insulating part in a reaction chamber before performing the hydrogen plasma treatment,
   wherein a process of passivating the surface of the insulating part comprises:
      supplying a nitrogen-based gas into the reaction chamber; and
      exciting the nitrogen-based gas in the reaction chamber using a plasma generator; and
   wherein exciting the nitrogen-based gas in the reaction chamber using the plasma generator is performed at a temperature in a range from 450° C. to 650° C.

2. The method of claim 1, wherein exciting the nitrogen-based gas in the reaction chamber using the plasma generator is performed at a pressure in a range from about 10 mTorr to about 150 mTorr.

3. The method of claim 1, wherein the insulating part is formed of quartz, $Al_2O_3$, AlN, or $Y_2O_3$.

4. The method of claim 1, further comprising supplying an inert gas in the reaction chamber before exciting the nitrogen-based gas in the reaction chamber using the plasma generator.

5. The method of claim 1, wherein exciting the nitrogen-based gas in the reaction chamber using the plasma generator is sustained for a duration in a range from 10 seconds to 10 minutes.

6. The method of claim 1, wherein an oxygen-based gas is not supplied into the reaction chamber while supplying the nitrogen-based gas into the reaction chamber.

7. The method of claim 1, wherein passivating the surface of the insulating part comprises nitrifying the surface of the insulating part.

8. The method of claim 1, wherein the nitrogen-based gas includes $N_2$, ammonia ($NH_3$), and/or hydrazine ($N_2H_4$).

9. A method for performing a plasma annealing treatment, comprising:
   converting at least a portion of a surface of an insulating part of a reaction chamber into a silicon oxynitride layer;
   loading a substrate in the reaction chamber; and
   performing a hydrogen plasma annealing treatment on the substrate.

10. The method of claim 9, wherein converting the at least a portion of the surface of the insulating part into the silicon oxynitride layer is performed in a state in which the substrate is not in the reaction chamber.

11. The method of claim 10, wherein a number of a step of converting the at least a portion of the surface of the insulating part into the silicon oxynitride layer is equal to a number of times a hydrogen plasma annealing treatment is performed on the substrate.

12. The method of claim 9, wherein the silicon oxynitride layer is converted into a silicon oxide layer while performing the hydrogen plasma annealing treatment on the substrate.

13. A method, comprising:
   performing at least one treatment cycle of a surface treatment for an insulating part in a reaction chamber, the surface treatment comprising passivating a surface of the insulating part, thereby forming a passivation layer; and
   during the at least one treatment cycle:
      loading a substrate in the reaction chamber; and
      performing a hydrogen plasma treatment on the substrate, wherein a surface of the passivation layer is modified during the hydrogen plasma treatment, thereby forming a modified surface having a composition different from that of the passivation layer.

14. The method of claim 13, wherein the passivation layer comprises silicon, oxygen and nitrogen.

15. The method of claim 13, wherein the modified surface includes silicon and oxygen.

16. The method of claim 13, wherein the hydrogen plasma treatment is a plasma treatment for at least one selected from the group consisting of an annealing process, an etching process and a deposition process.

17. The method of claim 13, further comprising performing multiple hydrogen plasma treatments during a common treatment cycle.

18. The method of claim 17, wherein the number of hydrogen plasma treatments performed during a common treatment cycle corresponds to a thickness of the passivation layer.

19. The method of claim 17, wherein performing multiple hydrogen plasma treatments comprises performing a hydrogen plasma treatment on multiple substrates.

20. The method of claim 1, wherein an oxygen-based gas is not supplied into the reaction chamber during the process of passivating the surface of the insulating part.

* * * * *